United States Patent [19]

Dieterich et al.

[11] 4,327,431
[45] Apr. 27, 1982

[54] VIDEO DISC PLAYER WITH VARIABLE OFFSET RFI REDUCTION CIRCUIT

[75] Inventors: Charles B. Dieterich, Princeton; Frank B. Lang, Princeton Junction, both of N.J.

[73] Assignee: RCA Corporation, New York, N.Y.

[21] Appl. No.: 204,827

[22] Filed: Nov. 7, 1980

[51] Int. Cl.³ .............................................. H04N 5/80
[52] U.S. Cl. ...................................... 369/126; 360/38; 358/128.5; 455/303; 375/102
[58] Field of Search ...................... 358/127, 128.5, 155, 358/167, 177; 455/296, 303; 375/102, 104; 360/38; 369/126, 128, 129, 124, 53; 179/1 P; 330/252

[56] References Cited

U.S. PATENT DOCUMENTS

| | | | |
|---|---|---|---|
| 2,996,576 | 8/1961 | Dolby | 360/38 |
| 3,605,018 | 9/1971 | Coviello | 455/306 |
| 4,021,852 | 5/1977 | Hurst | 358/8 |
| 4,039,959 | 8/1977 | Pattontyus-Abraham | 340/347 DD |
| 4,151,471 | 4/1979 | Packard | 455/296 |
| 4,189,745 | 2/1980 | Ushio | 358/128.5 |
| 4,203,134 | 5/1980 | Christopher | 358/128.5 |
| 4,238,777 | 12/1980 | Okada | 360/38 |

*Primary Examiner*—John H. Wolff
*Assistant Examiner*—Alan Faber
*Attorney, Agent, or Firm*—E. M. Whitacre; J. S. Tripoli

[57] ABSTRACT

Under certain conditions a video disc player can be responsive to externally applied interference signals to provide a defect in the display of the information recovered from the disc. Apparatus is provided between the pickup circuits and the normal defect compensation apparatus of the player to detect the presence of the external signals and to activate the normal defect compensation apparatus when the external signals are of a relatively high frequency and above a variable offset or threshold level. The threshold is made to vary as a function of the amplitude of the signal provided at the output of the pickup circuits.

3 Claims, 3 Drawing Figures

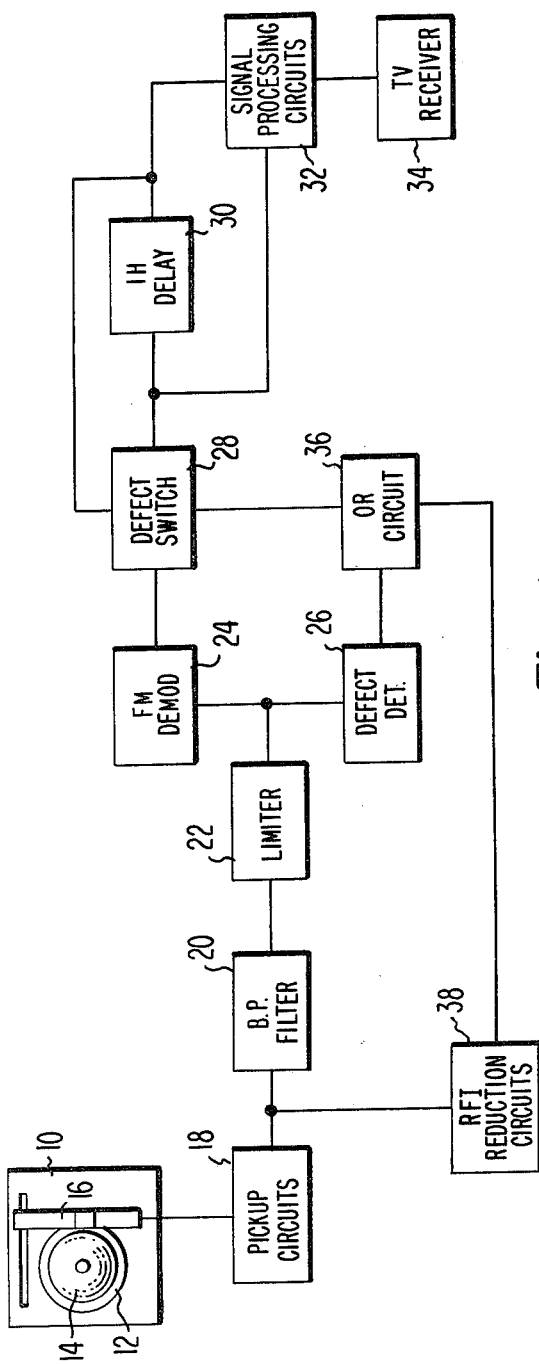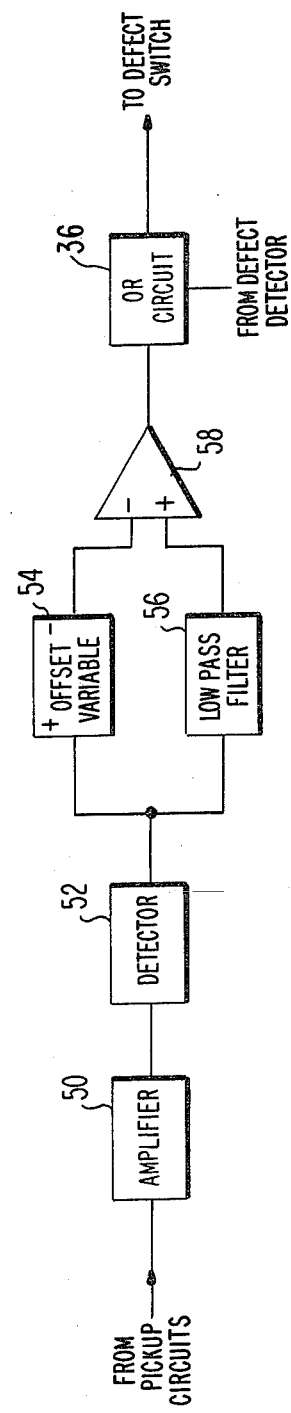
Fig. 1
Fig. 2

VIDEO DISC PLAYER WITH VARIABLE OFFSET RFI REDUCTION CIRCUIT

VIDEO DISC PLAYER WITH VARIABLE OFFSET RFI REDUCTION CIRCUIT

The present invention relates generally to video disc players and more particularly to video disc players having radio frequency interference reduction apparatus.

In certain types of video disc players, such as, for example, capacitive pickup video disc players, the signal pickup circuitry includes an oscillator operating in conjunction with a tuned circuit and a peak detector. An example of such pickup circuitry may be found in U.S. Pat. No. 4,080,625 issued to H. Kawamoto et al. on Mar. 21, 1978. The oscillator frequency in such systems is generally set at a value falling within the ISM (industrial, scientific, medical) allocation band, for example, 915 MHz. The power output of this oscillator at 915 MHz is usually low and does not generally represent a significant problem in terms of r.f. radiation outward. However, there are certain types of equipment which operate at high power levels in the ISM band, such as radars for example, and, if a number of conditions are met (such as frequency, power level, directivity and location, etc.) these outside sources of radiation can have an adverse affect on the playback operation of the video disc system.

This undesirable mode of operation appears to manifest itself in the following way. When an outside source is radiating at levels which are higher than those anticipated by the pickup circuit detector in normal player operation, the extraneous detected output signal is supplied to an FM detector which locks onto the extraneous signal. The extraneous signal is then demodulated and passed through the player signal processing circuits and displayed on the television receiver. If the extraneous signal is a pulse of short duration, say two microseconds, then the demodulated version may appear as a short interval of black or white on a horizontal line. This results from the fact that in FM systems of the type under consideration detection of high carrier frequencies is decoded as tending toward "white" level signals and detection of low carrier frequencies is detected as tending toward "black" level signals. These short duration interference signals may be noticeable to the discerning eye.

When the external source is of greater duration, say 125 microseconds, the effect is much more noticeable in the output display. Since one television horizontal line in the NTSC format is about 63 microseconds long, a condition may arise wherein two lines of the display will be white or black. Now if the outside source is a periodic type source, then two lines of the display will show up incorrectly on a corresponding periodic basis. This is noticeable even more than the previously mentioned situation.

There are various combinations of outside source power levels and duration which may produce other undesirable results in the final display such as a combination of light and dark spots on one or more horizontal lines of the display and even picture rolling if the FM demodulator falsely locks on to an extraneous signal when the vertical synchronization signal should normally be detected. In respect of all of the above identified display problems, it is desirable to provide a means to at least reduce the effects of the interference to a level which most observers would not even notice. Again, it should be noted that the problems mentioned arise only under a certain set of conditions.

In a concurrently filed application (Ser. No. 204,828) in the name of F. B. Lang et al. and assigned to the assignee of the present invention, a circuit solution is presented to alleviate the adverse effects mentioned above. The concurrently filed application provides a radio frequency interference (RFI) reduction circuit between the output of the player pickup circuitry and a defect switch via an OR circuit. In that arrangement, the RFI reduction circuit detects rapid changes above a certain amplitude level and then provides a signal to the defect switch via the OR circuit. When actuated the defect switch causes previously received information to be recirculated or substituted in place of the defective information.

Setting the certain amplitude above which the reduction ciircuit operates to provide the output signal to the defect compensation apparatus involves the application of an offset voltage in one of two conductive paths coupling the signal from the pickup circuit to a differential comparator. Signal levels below the offset do not actuate to the comparator and no output signal is provided by the reduction circuit. Signal levels above the offset level will cause an output signal to be provided to the defect compensation apparatus. The above operations will be explained in greater detail herein.

The present inventors have discovered a subtle problem which may arise in the operation of the circuit disclosed in the concurrently filed application. Video disc players of the type under consideration exhibit variations in detected signal levels from one stylus to the next and in the interface between a given stylus and different capacitive discs. As a result of these variations, the signal provided at the output of the pickup arm can vary from 0.05 volts to 1.2 volts. Normal playback operations allow for these variations but a problem could arise when it is desired to detect the aforementioned extraneous signal with a set threshold. The threshold in the concurrently filed application is set relative to the expected pickup arm output signal and if there are variations in the expected pickup arm output signal from player to player or from disc to disc in a given player, then the threshold or offset will not always be at the desired relative level. If this is the case, then sometimes the player will be too sensitive to normal variations and at other times extraneous signals will be both demodulated and displayed.

The present invention recognizes this possible problem and provides a variable threshold or offset in an RFI reduction circuit of the type described in the concurrently filed application.

In accordance with the present invention a video disc player is provided which includes: pickup apparatus for recovering a modulated carrier signal from a disc; demodulation apparatus; defect detection apparatus for detecting defects in the recovered signal; and defect compensation apparatus for providing a substitute signal in place of the recovered signal in the playback display during occurrences of defects in the recovered signal. The player further comprises an RFI reduction circuit connected between the pickup apparatus and the defect compensation apparatus. The RFI reduction circuit is responsive to rapid changes in the signal provided from the pickup apparatus and only to such changes which have a certain level of amplitude above the instantaneous value of the pickup apparatus signal.

In the drawing

FIG. 1 is a block diagram representing a video disc player including an RFI reduction circuit;

FIG. 2 is a block diagram of the RFI reduction circuit of the present invention.

Figure 3:
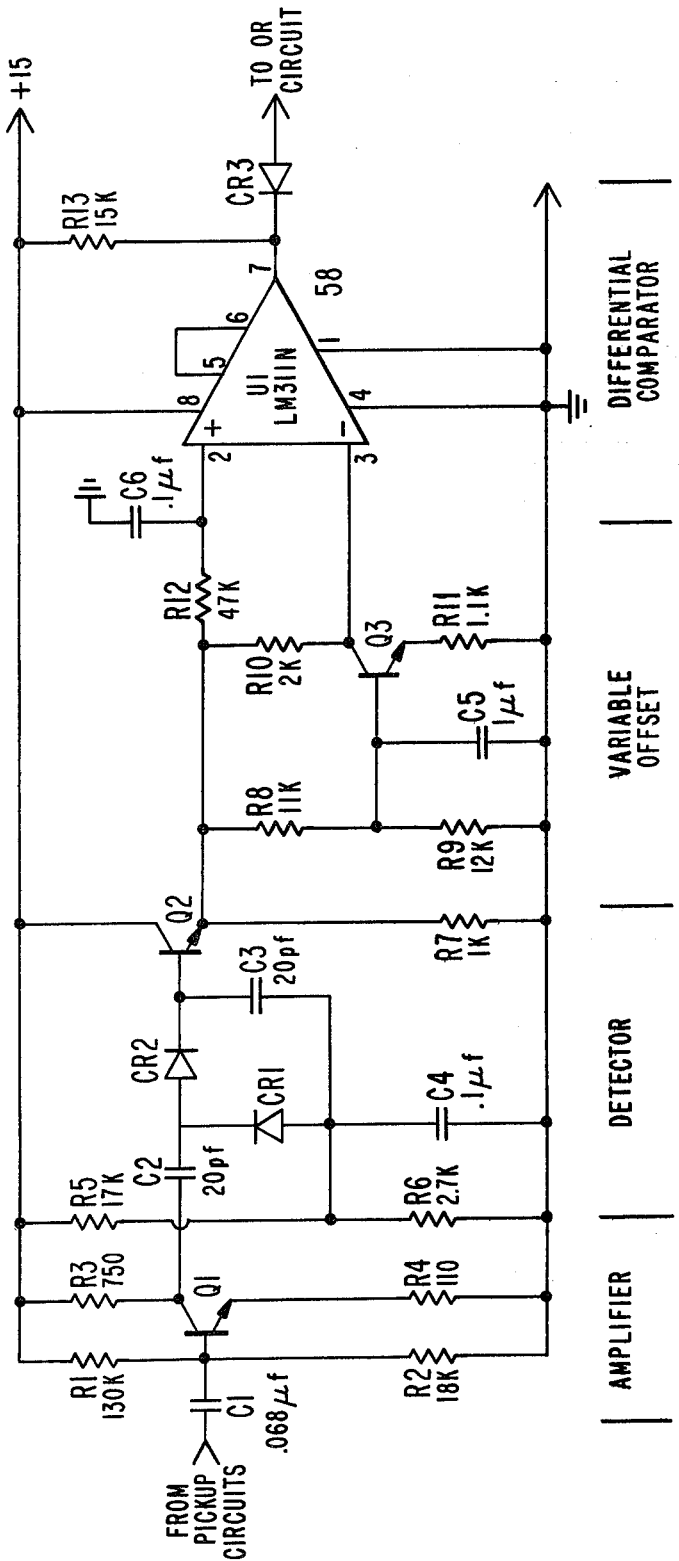
FIG. 3 is a detailed schematic diagram of the RFI circuit of FIG. 2.

In FIG. 1, a video disc player 10 is shown including a turntable 12 for supporting a video disc record 14 of the capacitance type. The player 10 also includes a carriage 16 which carries a pickup cartridge therein. Typically, the carriage moves in a timed relation to the speed of rotation of turntable 12 during playback.

Electrically coupled to the cartridge in the carriage 16 are the pickup circuits 18 of the general type described in the Kawamoto patent. Although shown as a box separated from the carriage 16, these circuits are preferably housed in the carriage. As described in Kawamoto, the output signal from pickup circuitry 18 is a frequency modulated signal. This signal is bandpass filtered at 20. The signal at the output of filter 20 corresponds to the video information recorded on the disc. The video is recorded on a 5 MHz carrier with the black level causing zero deviation, sync tips at 4.3 MHz deviation and peak white at 6.3 MHz deviation. The FM audio carrier is at 716 KHz with a deviation of plus and minus 50 KHz. For purposes of discussing the present invention, only the video signal path will be considered and thus the bandpass filter 20 only passes the video frequencies of interest. The video signal is limited in limiter 22 to provide an appropriate signal to the FM demodulator 24 and defect detector 26.

FM demodulator 24 is a phase-locked-loop type and defect detector 26 is a latching comparator type. Both of these devices are of the type disclosed in U.S. Pat. No. 4,203,134 issued to T. J. Christopher et al. on May 13, 1980. The Christopher et al. patent also describes the function and operation of the defect switch 28, the 1H delay line 30 and the signal processing circuits 32 for providing a signal for display on the TV receiver 34. For an even more detailed description and explanation of the function and operation of elements 30 and 32 reference should be made to U.S. Pat. No. 4,195,309 issued to T. J. Christopher et al. on Mar. 25, 1980.

In general terms, the circuit of FIG. 1 thus far described performs as follows. The pickup circuits 18 provide a frequency modulated signal which is filtered at 20 to develop the video FM signal which is then limited at 22. In the FM demodulator 24, the phase of the recovered signal is compared to that of a voltage controlled oscillator (VCO) to develop a signal which when low pass filtered provides a demodulated version of the video information. The defect detector 26 compares the recovered signal with the output of the VCO in the demodulator 24 and when the phase of the recovered signal is out of a certain range relative to the VCO signal, a defect indication pulse is generated and provided through circuitry which includes an OR function 36. A defect signal coupled via the OR circuitry 36 is used to operate the defect switch 28. When operated switch 28 causes information signals which were previously recovered to be re-used by passing signals coupled from the output of the 1H delay line 30. The recirculation or re-use of previously recovered information continues for as long as the switch 28 is held in the re-use position.

Now, in accordance with the present invention, the arrangement of FIG. 1 further comprises a radio frequency interference reduction apparatus 38 which may comprise several circuit functions. RFI reduction apparatus 38 is electrically connected between the output terminal of the pickup circuits 18 and an input terminal of the OR circuit 36. Apparatus 38 could be connected to the output of filter 20 since the filtered signal includes the information used in the operation of the RFI reduction scheme. Apparatus 38 is used to detect anomalous signals from outside sources, as discussed above, and develop an appropriate signal which will activate the defect switch 28, via the OR circuit 36. By so doing, apparatus 38, in cooperation with the other elements mentioned, causes previously recovered information to be recirculated through switch 28 so that instead of seeing white or black lines appearing across the display, something more like that which should appear will be displayed. In most cases, the substitution of one line or less as described above cannot be noticed by the general observer. Even the substitution of the same line twice in a sequence, which is on the order of a 125 microsecond defect, is barely noticeable to most observers.

It will be recalled that the output signals from the defect detector 26 and the RFI reduction apparatus 38 are OR'ed at 36. It is desired to have the normal defect detection and substitution take place in the usual fashion so that out of band deviations due to signal defects are handled in the usual way. At the same time, when a strong abrupt outside signal gets picked up the system should see this and respond with a substitution recirculated through switch 28. Care must be taken to set the proper limits on both defect detections to avoid unnecessary signal substitutions.

A block diagram of the RFI reduction apparatus is shown in FIG. 2. The signal from the pickup circuits 18 is coupled to an amplifier 50. Amplifier 50 sets up the amplitude level of the recovered signal for further processing. A peak detector 52 responds to the amplifier output signal to detect the envelope of the amplified, recovered signal. The detected envelope is then provided to two conductive paths. One of the two paths includes a variable offset voltage provided by variable offset circuit 54. The other path includes a low pass filter 56. These two paths are coupled to a differential comparator circuit 58. In FIG. 2 the upper path is a wideband path which adds the variable d.c. offset to the detected signal (the offset may be in either path). This offset provides a threshold relative to the peak detected signal so that small variations in the signal provided from the pickup circuits 18 do not cause the defect switch to be activated. The lower path includes the low pass filter 56 which does not pass rapid changes in the signal but does pass low frequency variations as well as the d.c. component. The net effect resulting from the coupling of signals to the input terminals of the differential comparator 58, as shown in FIG. 2, is that comparator 58 responds only to the rapid, low duty cycle amplitude variations of the signal from the pickup circuits 18 when such variations exceed the offset voltage. Again, the offset is made to vary as a function of the amplitude of the detected signal. Relatively slow amplitude changes appear as a common mode signal to the comparator and thus do not cause the comparator to put out a signal to actuate the defect switch 28.

FIG. 3 shows a specific embodiment for the RFI reduction apparatus 38. The output signal from the pickup circuits 18 is coupled via capacitor C1 to the base of transistor Q1. The amplified output is taken from the collector of Q1 and provided to the peak detector which includes capacitors C2 and C3 and diode CR1 and CR2. The detector circuit produces an output signal relative to a bias potential set by resistors R5 and R6, and capacitor C4. The peak detected signal, or envelope of the signal provided from the pickup apparatus 18, is provided at the base of the emitter follower transistor Q2. The output signal taken at the emitter of transistor Q2 is provided to the circuit comprising resistors R8 and R9 and capacitor C5. This circuit provides an input signal to the base of transistor Q3 which has a collector load resistor R10. Resistor R12 and capacitor C6 form the low pass filter connected to the non-inverting input terminal of differential comparator 58. The collector of transistor Q3 is connected to the inverting input terminal of comparator 58. Resistor R13 and diode CR3 isolate stray circuit capacity from the defect switch node via OR circuit 36. When the comparator 58 has an open collector output, resistor 13 and diode CR3 may not be needed. In the embodiment shown in FIG. 3, diode CR3 is part of the OR circuit 36.

In operation, when the signal provided from the pickup circuits 18 increases in amplitude the peak detector provides an increased output signal. This in turn provides an increased drive to the base of transistor Q3.

The combination of resistors R8, R9 and capacitor C5 tends to integrate or average out the increased drive level to transistor Q3. As the drive level to transistor Q3 increases more current is drawn through resistor R10 thereby increasing the potential drop thereacross and thus increasing the offset as seen by the comparator 58.

Thus, with the circuit of FIG. 3, it is possible to set up an initial biasing for some nominal output from the pickup circuits to provide an initial offset and if that nominal value should rise the offset will rise proportionately and if the nominal value falls the offset will fall. The arrangement permits the use of the generalized approach to RFI reduction for a variety of styli in a given player and for a variety of discs relative to a given stylus.

What is claimed is:

1. In a video disc player of the type having: pickup apparatus for recovering an information signal recorded on a disc in the form of a modulated carrier signal; demodulation apparatus; defect detection apparatus for detecting defects in the recovered signal; and defect compensation apparatus responsive to the operation of the defect detection apparatus for providing a substitute signal in place of the recovered signal in the playback display of said information signals during occurrences of defects in the recovered signal; said player being subject to interference with normal playback display operations due to the pickup of unrecorded, externally applied signals; apparatus for reducing the influence of said external signals comprising:

an amplifier responsive to the signal provided by said pickup apparatus;

a signal detector for detecting amplitude variations in the amplifier output signal;

first and second conductive paths coupled to an output terminal of said detector, said first path being responsive to a wide band of frequencies, said second path being responsive to a relatively low band of frequencies, one of said paths having a means for providing a variable d.c. offset, said offset varying as a function of said detected amplitude variations;

said means for providing a variable d.c. offset comprising: an integrator circuit responsive the output of said detector; a transistor having a base electrode coupled to said integrator circuit, a collector electrode coupled to one end of a load resistor and an emitter electrode coupled to a point of reference potential; the other end of said load resistor being coupled to an output terminal of said signal detector; and said collector electrode being connected to said first conductive path;

a voltage comparator coupled to said first and second paths for providing an output signal in response to a detected signal having an amplitude greater than said offset voltage and a frequency higher than said low band of frequencies; and means coupling said comparator output signal to said defect compensation apparatus.

2. The apparatus according to claim 1 further comprising a low pass filter connected to said second path.

3. The apparatus according to claim 2 wherein said comparator comprises a differential comparator having an inverting input terminal and a non-inverting input terminal and wherein said first conductive path is connected to said inverting terminal and said second conductive path is connected to said non-inverting terminal.

* * * * *